United States Patent [19]

Nilsson

[11] Patent Number: 5,781,575
[45] Date of Patent: Jul. 14, 1998

[54] SURFACE EMITTING LASER DEVICE WITH A VERTICAL CAVITY

[75] Inventor: Olle Nilsson, Fjärås, Sweden

[73] Assignee: Telefonaktiebolaget LM Ericsson, Stockholm, Sweden

[21] Appl. No.: 775,886

[22] Filed: Jan. 2, 1997

Related U.S. Application Data

[62] Division of Ser. No. 303,623, Sep. 9, 1994, abandoned.

[30] Foreign Application Priority Data

Oct. 9, 1993 [SE] Sweden .................. 9302950

[51] Int. Cl.[6] ......................................... H01S 3/19
[52] U.S. Cl. .......................... 372/50; 372/45; 372/96; 372/68
[58] Field of Search ............................ 372/45, 43, 33, 372/92, 96, 68, 50; 257/88

[56] References Cited

U.S. PATENT DOCUMENTS

| | | | |
|---|---|---|---|
| 4,316,156 | 2/1982 | Scifres et al. | 372/50 |
| 4,573,161 | 2/1986 | Sakai et al. | 372/45 |
| 4,602,370 | 7/1986 | Tsang | 372/45 |
| 4,817,103 | 3/1989 | Holonyak, Jr. et al. | 372/45 |
| 4,908,843 | 3/1990 | Baer | 372/75 |
| 4,912,533 | 3/1990 | Takahashi | 257/94 |
| 4,916,712 | 4/1990 | Bender | 372/75 |
| 5,052,016 | 9/1991 | Mahbobzadeh et al. | 372/96 |
| 5,115,442 | 5/1992 | Lee et al. | 372/96 |
| 5,133,809 | 7/1992 | Sichanugrist et al. | 437/4 |
| 5,212,706 | 5/1993 | Jain | 372/50 |

FOREIGN PATENT DOCUMENTS

| | | |
|---|---|---|
| 239 352 | 9/1987 | European Pat. Off. . |
| 370 830 | 5/1990 | European Pat. Off. . |
| 475 373 | 3/1992 | European Pat. Off. . |

OTHER PUBLICATIONS

P. J. Edwards, "Low-Noise Optoelectronic Amplifier Using Sub-Shot Noise Light," Electronics Letters, vol. 29, No. 3, pp. 299–301 (Feb. 4, 1993).

J. P. van der Ziel et al., "Integrated Multilayer GaAs Lasers Separated by Tunnel Junctions," Appl. Phys. Lett., vol. 41, No. 6, pp. 499–501 (Sep. 15, 1982).

*Primary Examiner*—Rodney B. Bovernick
*Assistant Examiner*—Yisun Song
*Attorney, Agent, or Firm*—Burns, Doane, Swecker & Mathis, L.L.P.

[57] ABSTRACT

A surface emitting laser device with at least two active regions in one and the same optical, vertical cavity wherein the active regions are electrically connected in series.

18 Claims, 2 Drawing Sheets

SURFACE EMITTING LASER DEVICE WITH A VERTICAL CAVITY

This application is a divisional of application Ser. No. 08/303,623, filed Sep. 9, 1994, now abandoned.

BACKGROUND

The present invention relates to a surface emitting laser device with at least two active regions in one and the same optical cavity, the cavity being vertical and vertically substantially surrounded by dielectrical reflecting means. Such devices may find their application within a number of different fields, such as for example optical communication systems etc. It is general for so called surface emitting vertical cavity-lasers (Surface Emitting Vertical Cavity Lasers) that the losses in electrical power due to resistance in the optical reflectors give rise to difficulties when such devices are to be fabricated in practice.

In most applications with diode lasers it is tried to obtain a threshold current, i.e. the lowest electrical feeding current for which lasering occurs, which is as low as possible. This is very hard to achieve. Normally diode lasers also have a very low electrical input impedance and therefore the construction of broad-band feeding circuits while still maintaining a high efficiency is very difficult.

STATE OF THE ART

A number of different laser devices with two or more active regions are known, e.g. so called strip-lasers. Moreover, these devices have several active regions in order to provide a higher power, furthermore such lasers are not surface emitting. A so called large optical cavity laser is known e.g. from U.S. Pat. No. 4,602,370. This device has a number of active layers in the optical cavity. These active layers are however not electrically connected in series and the optical losses will be high. They arise since the contact layers are located in regions which have an electrical field strength as high as that of the active layer.

In "Integrated Multilayer GaAs Lasers Separated by Tunnel Junctions" of J P vander Ziel and W T Tsang, Appl Phys Lett 41(6), 15 Sep. 1982, three so called double-heterostructure GaAs-laser diodes are electrically connected in series through reversed tunnel junctions. This device does however not describe a surface emitting laser device and it also does not form a vertical optical cavity since it does not comprise any dielectric reflecting devices. Since the active layers in such a device are arranged at a comparatively large distance from each other, which as such is necessary in this case, the optical output signals from the different lasers will be incoherent since the lasers are not connected to each other.

General for all vertical surface emitting lasers, i.e. lasers with a vertical cavity, is that the electrical reflector losses, i.e. due to resistance in the reflectors, are very important and it is extremely difficult to obtain an impedance which is sufficiently high across the active region. This is very problematical since a high impedance across the active region can be a great advantage in a number of applications.

The reflectors in such devices have essentially two different functions, namely, on one hand to really act as reflectors or mirrors which put requirements on the material such that it has to have good optical properties, among others low optical losses etc. and on the other hand that they should conduct current to the next active region. The last function requires good conductive properties of the device, preferably that should be highly doped and have a low resistance. The requirements coming from the different functions are conflicting and incompatible which in turn leads to solutions in the form of compromises which leads to large voltage drops in the reflectors.

In applicant's U.S. patent application Ser. No 08/303,624 filed Sep. 9, 1994 now U.S. Pat. No. 5,568,498 issued Oct. 22, 1996 "Laser device with laser structures connected in series in an optical cavity" a laser device is described which comprises at least two in one and the same optical cavity arranged laser structures which are electrically connected in series. The laser structures are in this case substantially parallelly arranged in parallel relation to each other.

Furthermore in Applicant's U.S. patent application, "Optical amplifying device" application Ser. No. 08/303,621, filed Sep. 9, 1994 now abandoned and continued as application Ser. No. 08/775,911 an amplifying device described which uses laser structures or active regions which are electrically connected in series for example in a vertical cavity. Both of these applications are incorporated by reference in this application.

Normally so called diode lasers comprise one or sometimes more active regions electrically connected in parallel. Then each electron that is injected into the active region generates one photon. See FIG. 1 which illustrates a normal, conventional laser with the feeding current 4I.

SUMMARY OF THE INVENTION

It is an object with the present invention to provide a surface emitting laser device as initially referred to through which the resistive, electrical losses which are introduced through the dielectrical reflecting devices are reduced, i.e. the voltage drop across the reflectors. The invention then among others seeks to reduce the relative importance of the electrical reflector losses. Another object of the invention is to reduce the threshold current for a given power. It is also an object with the invention to be able to increase the electrical feeding impedance and at the same time lower the threshold current. It is also a general object with the invention to be able to adapt the impedance upwards. Another object with the invention is to provide a device which gives a good and even better amplification without the voltage drop across the reflectors increasing. A further object with the invention is to provide a device which is quite simple and easy to fabricate as well as it is easy to use and which has a great field of applicability, i.e. that it is applicable in a number of different areas, for example within optical transmission technology, optical interconnection technology, for example between two semi-conductor-chips ("Optical Interconnect"), etc.

Those as well as other objects are achieved through a device as initially referred to wherein the active regions are electrically connected in series.

According to an advantageous embodiment the active regions as well as between those arranged contact regions or layers are parallel with the standing wave planes or wave fronts produced by the optical field, i.e. perpendicular to the direction of propagation of the waves. Particularly the active regions are arranged in horizontal planes corresponding to maxima in the electric-optical field and the electrical contact regions or the contact layers are arranged in horizontal planes corresponding to minima in the optical electrical field. The electrical reflection devices comprise particularly first and second dielectrical Bragg devices. Among those dielectrical Bragg devices the first one is arranged on the top where it substantially delimits the vertical cavity and it is also somewhat transparent. The other Bragg device is arranged at the bottom and according to an advantageous embodiment is maximally reflecting. The first and second Bragg devices are surrounded by upper and lower contact layers respectively wherein the upper contact layer is substantially transparent. According to a particular embodiment the laser device comprises four active regions or layers. According to a particular embodiment furthermore the active regions or layers may have a so called quantum well structure. Furthermore the electrical contact layers or the layers may particularly be of tunnel-diode-type with thin, highly doped layers. The device particularly forms a laser device and emits laser light. According to an alternative embodiment the device emits light of LED-character, i.e. when the currents are lower than the threshold current.

BRIEF DESCRIPTION OF THE DRAWINGS

The invention will in the following be further described in a non-limiting way under reference to the accompanying drawings wherein.

DETAILED DESCRIPTION OF THE INVENTION

Figure 1:
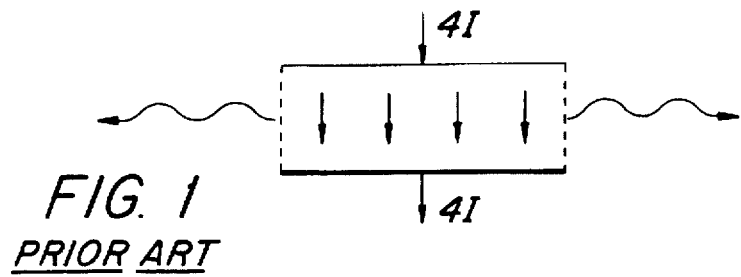
FIG. 1 illustrates the feeding current in a conventional laser, FIG. 2 schematically illustrates a vertical cavity laser of the surface emitting kind.
Figure 2:
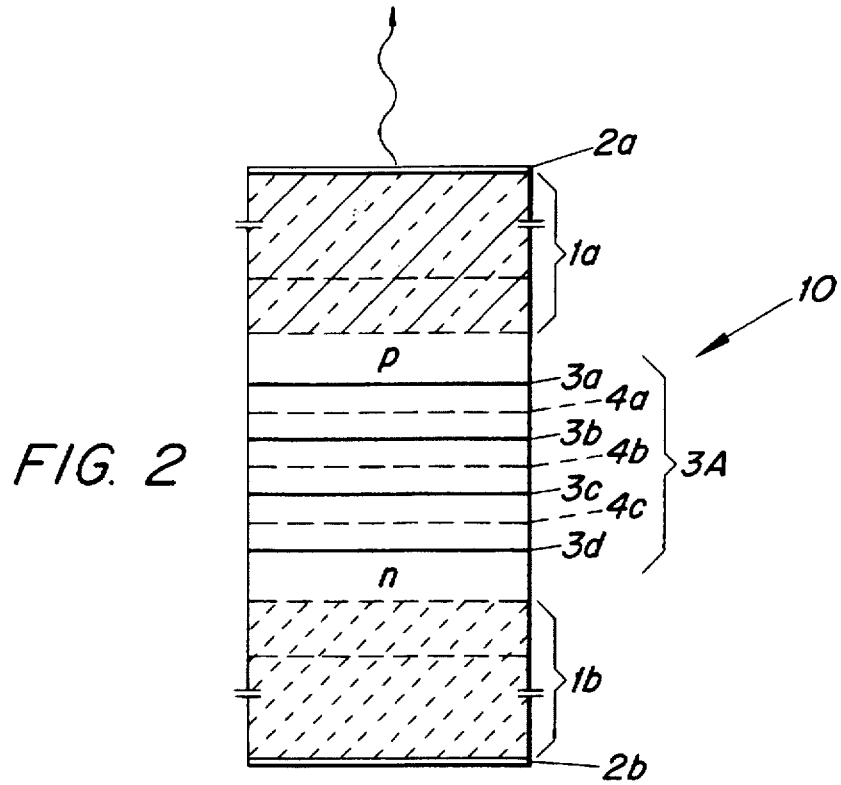
FIG. 2a illustrates an active region according to FIG. 2.
FIG. 2b illustrates a contact region or a contact layer according to FIG. 2.
Figure 2A:
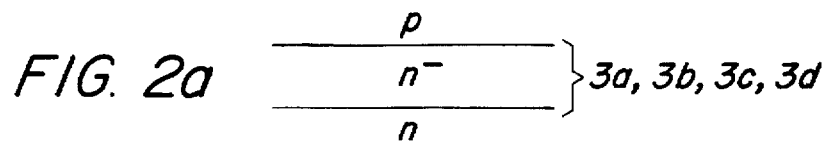
Figure 2B:
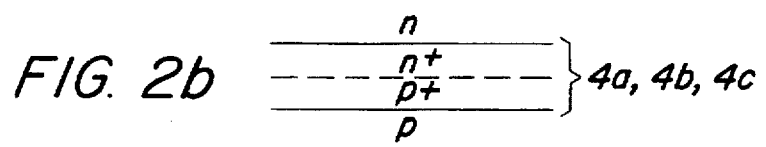
Figure 3:
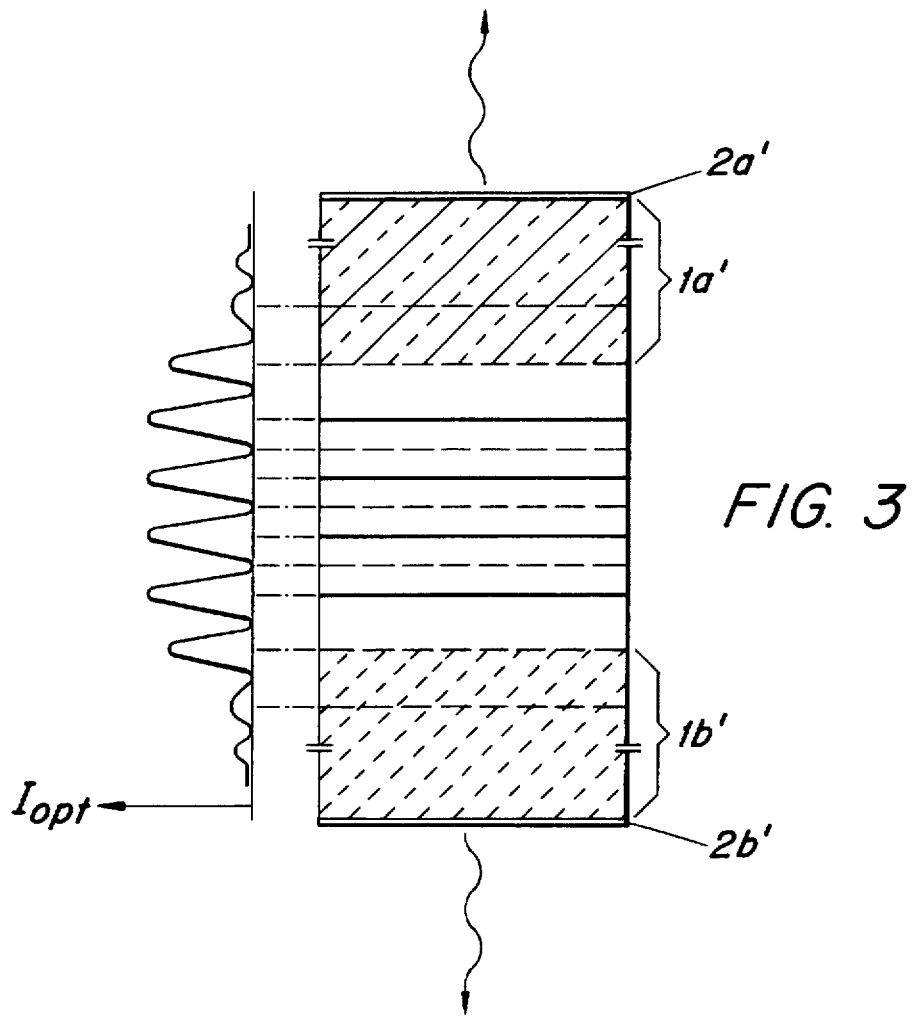
FIG. 3 illustrates a device according to the invention with a curve illustrating the optical intensity, FIG. 4 schematically illustrates an example of a device according to the invention.

In FIG. 2 a device 10 is illustrated wherein an optical, vertical cavity is formed by a first and a second dielectric Bragg reflection device 1a, 1b. The first Bragg reflection device 1a is arranged in the upper part of the vertical device and it is advantageously somewhat transparent. On top of this first reflecting device an upper contact layer 2a is arranged. In the shown embodiment this is translucent or transparent. Still further, in the illustrated embodiment the lower Bragg reflection device 1b is as reflective as possible and under this a lower contact layer 2b is arranged. Between the two Bragg reflection devices 1a, 1b four active regions or layers 3a, 3b, 3c, 3d are arranged between which contact regions or contact layers 4a, 4b, 4c are arranged. The active regions or the layers 3a, 3b, 3c, 3d are more clearly illustrated in FIG. 2a. In this case the active region is slightly n-doped (n⁻). Other alternatives are of course also possible, for example it could be slightly p-doped (p⁻), but this constitutes a technique which as such is known per se. The active regions or the layers 3a, 3b, 3c, 3d may according to a particular embodiment form a quantum well structure. The contact regions or the contact layers 4a, 4b, 4d are more clearly illustrated in FIG. 2b. The contact layers 4a, 4b, 4c may according to a particular embodiment be of the kind of tunnel diodes with thin highly doped layers which can be seen from the figure. In the illustrated embodiment is shown how the light is emitted. This can be in form of laser light or of LED character, i.e. corresponding to a case as when is above or below the threshold current level. In FIG. 3 the device according to FIG. 2 is illustrated with a curve illustrating the optical intensity and it can be seen that each contact layer or contact region 4a, 4b, 4c is located in a plane corresponding to a minimum in optical intensity $I_{opt}$ whereas each active region 3a, 3b, 3c, 3d is located in a region corresponding to a maximum in optical intensity $I_{opt}$. An optical standing wave pattern is for example introduced through an electrical feeding signal $I_{in}$, i.e. when I exceeds the threshold current an optical standing wave pattern is formed with four (four since according to the embodiment there are four active regions) intensity peaks. The standing wave pattern declines in the Bragg reflection devices 1a, 1b. The optical losses are reduced since a maximum only occurs precisely in the active region. With four active regions 3a, 3b, 3c, 3d four voltage drops of for example each 1 V is obtained. (1 V of course merely gives an example for an illustrative purpose). This would give a total voltage drop of 4 V. With four active regions 3a, 3b, 3c, 3d the amplification will be higher without the voltage drop across the reflectors getting any larger, which voltage drop actually is a parasitic voltage drop (c.f. FIG. 1). In the illustrated embodiment light is emitted upwards (FIG. 2). According to alternative embodiments this could of course be upwards as well as downwards or in both directions (FIG. 3) in which cases the device is adapted thereto. Through the invention the relative significance of the reflection losses is reduced at the same time as it gets possible to reduce the current for a given power, i.e. the impedance is increased. Then the adaption to cables which normally for example have an impedance of 50 ohm is simplified or even enabled. It has up to now been very difficult to fabricate transmission cables which deviate considerably from 50 ohm, c.f. coaxial cables and µ-strip-cables respectively. Through the invention it will be possible to vary (increase) the impedance across the active regions, for example with a factor of 16 of the same time as the threshold current is lowered with about, for a given power, a factor 4. (Of course these factors are merely given for illustrative purposes, corresponding to four active regions.

According to the invention the useful voltage drop, i.e. the voltage drop across the active regions (corresponding to the power which is converted to optical power) gets four times greater when the device comprises four active regions, in a generalized manner n times greater if the device has n active regions, compare the case as illustrated in FIG. 1. Furthermore n (in the shown embodiment n=4) gives rise to a higher amplification which is why a smaller reflectivity in the reflectors can be accepted since the requirements thereon decrease, they can be made thinner etc.

Figure 4:
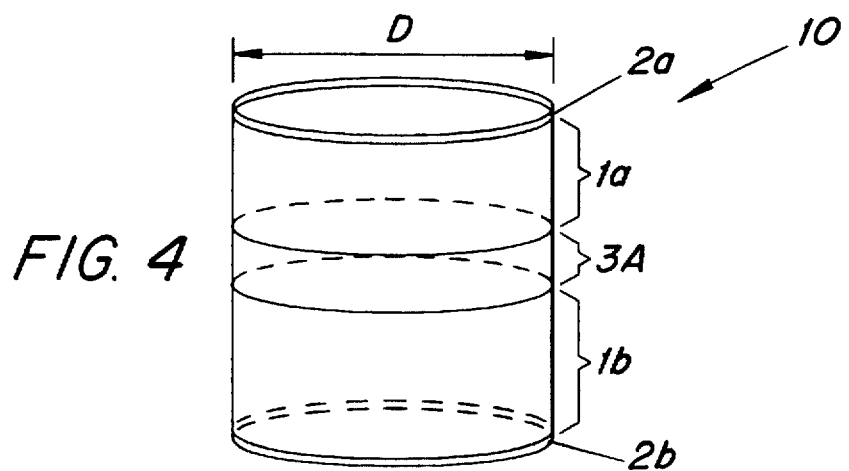

In FIG. 4 an example of a device according to the invention is illustrated which has a cylindrical cross section. According to one embodiment the first Bragg reflection device may have a thickness of about 2–10 µm and the second Bragg reflection device may have a thickness of about 3–10 µm. With four regions electrically connected in series forming a complete active region 3A those might according to the shown embodiment for example have a thickness of 0.75 µm. The diameter D of the cylindrical device may for example be about 4 µm. Of course this merely gives an example and there are of course a great number of other possibilities.

Examples of materials are GaAlAs (particularly for shorter wave lengths such as λ=0.8µ) and InGaAsP for longer wave lengths (for example λ=1.3–1.6µ). Of course a number of other materials can also be used.

The invention is of course not limited to the shown embodiments but it can be varied in a number of ways within the scope of the claims. Even if one embodiment with four active layers or regions has been illustrated, it is of course possible to have fewer as well as more active regions. Furthermore the active layers and the electrical contact regions may be of a conventional character, the reflection devices can take many different forms etc.

What is claimed is:

1. A surface emitting laser device with at least two active regions in one optical cavity, the optical cavity being vertical and vertically substantially confined by or limited by two dielectrical reflecting devices, wherein a vertical optical standing wave pattern is created in the optical cavity, the active regions are electrically connected in series and arranged in horizontal planes corresponding to maximum electro-optical field strength and the voltage drop across the active regions is proportional to the number of active regions of the device, electrical contact regions are arranged in horizontal planes corresponding to minimum electro-optical field strength, and the device emits laser light generated in one single beam that comprises only one mode.

2. A device as in claim 1,
wherein the laser device is pumped electrically through a current (I) which flows vertically through the laser device via an upper and a lower contact.

3. A device as in claims 2,
wherein the electrical contact regions are arranged between the active regions.

4. A device as in claim 3,
wherein the active regions and the contact regions are perpendicular to a direction of propagation of the standing waves.

5. A device as in claim 1,
wherein the dielectrical reflecting devices comprise first and second dielectric Bragg devices.

6. A device as in claim 5, wherein the first Bragg device is partially transparent and arranged in an upper part of the device.

7. A device as in claim 6, wherein the first and as the second Bragg device are partially transparent.

8. A device as in claim 5,
wherein the second Bragg device is maximally reflecting and arranged in the lower part.

9. A device as in claim 5,
wherein the first and the second Bragg devices respectively are surrounded by upper and lower contact layers respectively whereupon at least the upper contact layer is substantially transparent.

10. A device as in claim 1,
wherein the device comprise regions.

11. A device as in claim 1,
wherein the active regions include quantum wells.

12. A device as in claim 3,
wherein the electrical contact regions are of the type of tunnel-diodes with thin, highly doped layers.

13. A surface emitting diode laser arrangement, with at least two active regions in one and the same optical cavity, the optical cavity being vertical and vertically substantially confined by two dielectrical reflecting devices, wherein a vertical optical standing wave pattern is created in the optical cavity, the active regions are electrically connected in series and arranged in horizontal planes corresponding to maximum electro-optical field strength, electrical contact regions are arranged in horizontal planes corresponding to minimum electro-optical field strength, and the arrangement emits laser light generated in one single beam that comprises only one mode.

14. A device as in claim 1, wherein the laser light is emitted at a current threshold that is substantially inversely proportional to the number of active regions.

15. A device as in claim 13, wherein the laser light is emitted at a current threshold that is substantially inversely proportional to the number of active regions.

16. A surface emitting laser device with at least two active regions in one optical cavity, the optical cavity being vertical and vertically substantially confined by two dielectrical reflecting devices, wherein a vertical optical standing wave pattern is created in the optical cavity, the active regions are electrically connected in series and arranged in horizontal planes corresponding to maximum electro-optical field strength, electrical contact regions are arranged in horizontal planes corresponding to minimum electro-optical field strength, and the device emits laser light generated in a one single beam that comprises only one mode at a current threshold that is substantially inversely proportional to the number of active regions.

17. The device according to claim 16, wherein the active regions are identical.

18. The device according to claim 16, wherein the impedance across the active regions for a give power is increased at the same time as the threshold current is lowered.

* * * * *